(12) United States Patent
Bang et al.

(10) Patent No.: US 7,053,485 B2
(45) Date of Patent: May 30, 2006

(54) MICROELECTRONIC PACKAGES WITH SELF-ALIGNING FEATURES

(75) Inventors: Kyong-Mo Bang, Sunnyvale, CA (US); Teck-Gyu Kang, San Jose, CA (US); Jae M. Park, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 63 days.

(21) Appl. No.: 10/640,177

(22) Filed: Aug. 13, 2003

(65) Prior Publication Data

US 2004/0104470 A1 Jun. 3, 2004

Related U.S. Application Data

(60) Provisional application No. 60/403,939, filed on Aug. 16, 2002.

(51) Int. Cl.
| | |
|---|---|
| H01L 23/04 | (2006.01) |
| H01L 23/544 | (2006.01) |
| H01L 23/34 | (2006.01) |
| H05K 1/00 | (2006.01) |

(52) U.S. Cl. .................. 257/730; 257/797; 257/727; 361/749

(58) Field of Classification Search ............... 257/727, 257/732, 678, 730, 731, 797, 787; 361/749
See application file for complete search history.

(56) References Cited

U.S. PATENT DOCUMENTS

| | | | |
|---|---|---|---|
| 3,390,308 A | 6/1968 | Marley | |
| 3,923,359 A | 12/1975 | Newsam | |
| 4,371,912 A | 2/1983 | Guzik | |
| 4,489,364 A | 12/1984 | Chance | |
| 4,540,226 A | 9/1985 | Thompson et al. | |
| 4,638,348 A | 1/1987 | Brown et al. | |
| 4,734,825 A | 3/1988 | Peterson | |
| 4,754,316 A | 6/1988 | Reid | |
| 4,841,355 A | 6/1989 | Parks | |
| 4,868,712 A | 9/1989 | Woodman | |
| 4,897,918 A | 2/1990 | Osaka et al. | |
| 4,956,694 A | 9/1990 | Eide | |
| 4,982,265 A | 1/1991 | Watanabe et al. | |
| 4,994,902 A | 2/1991 | Okahashi et al. | |
| 4,996,583 A | 2/1991 | Hatada | |
| 4,996,587 A | 2/1991 | Hinrichsmeyer et al. | |
| 5,028,986 A | 7/1991 | Sugano et al. | |
| 5,045,921 A | 9/1991 | Lin et al. | |

(Continued)

FOREIGN PATENT DOCUMENTS

JP         52-075981         6/1977

(Continued)

OTHER PUBLICATIONS

U.S. Appl. No. 07/552,578, filed Jul. 13, 1990, Forthun.

(Continued)

*Primary Examiner*—Zandra V. Smith
*Assistant Examiner*—Kiesha Rose
(74) *Attorney, Agent, or Firm*—Lerner, David, Littenberg, Krumholz & Mentlik, LLP

(57) ABSTRACT

A microelectronic package is made by a process which includes folding a substrate. Alignment elements on different parts of the substrate engage one another during the folding process to position the parts of the substrate precisely relative to one another. One or more of the alignment elements may be a mass of an overmolding encapsulant covering a chip.

10 Claims, 5 Drawing Sheets

U.S. PATENT DOCUMENTS

| | | |
|---|---|---|
| 5,117,282 A | 5/1992 | Salatino |
| 5,128,831 A | 7/1992 | Fox, III et al. |
| 5,138,438 A | 8/1992 | Masayuki et al. |
| 5,148,265 A | 9/1992 | Khandros et al. |
| 5,172,303 A | 12/1992 | Bernardoni et al. |
| 5,198,888 A | 3/1993 | Sugano et al. |
| 5,222,014 A | 6/1993 | Lin |
| 5,247,423 A | 9/1993 | Lin et al. |
| 5,266,912 A | 11/1993 | Kledzik |
| 5,281,852 A | 1/1994 | Normington |
| 5,311,401 A | 5/1994 | Gates, Jr. et al. |
| 5,313,096 A | 5/1994 | Eide |
| 5,334,875 A | 8/1994 | Sugano et al. |
| 5,337,077 A | 8/1994 | Browne |
| 5,376,825 A | 12/1994 | Tukamoto et al. |
| 5,384,689 A | 1/1995 | Shen |
| 5,397,916 A | 3/1995 | Normington |
| 5,412,247 A | 5/1995 | Martin |
| 5,455,740 A | 10/1995 | Burns |
| 5,479,318 A | 12/1995 | Burns |
| 5,489,749 A | 2/1996 | DiStefano et al. |
| 5,543,664 A | 8/1996 | Burns |
| 5,548,091 A | 8/1996 | DiStefano et al. |
| 5,552,631 A | 9/1996 | McCormick |
| 5,552,963 A | 9/1996 | Burns |
| 5,600,541 A | 2/1997 | Bone et al. |
| 5,608,265 A | 3/1997 | Kitano et al. |
| 5,616,958 A | 4/1997 | Laine et al. |
| 5,625,221 A | 4/1997 | Kim et al. |
| 5,637,536 A | 6/1997 | Val |
| 5,639,695 A | 6/1997 | Jones et al. |
| 5,642,261 A | 6/1997 | Bond et al. |
| 5,656,856 A | 8/1997 | Kweon |
| 5,659,952 A | 8/1997 | Kovac et al. |
| 5,668,405 A | 9/1997 | Yamashita |
| 5,677,566 A | 10/1997 | King et al. |
| 5,681,777 A | 10/1997 | Lynch et al. |
| 5,701,031 A | 12/1997 | Oguchi et al. |
| 5,734,555 A | 3/1998 | McMahon |
| 5,751,063 A | 5/1998 | Baba |
| 5,783,870 A | 7/1998 | Mostafazadeh et al. |
| 5,784,264 A | 7/1998 | Tanioka |
| 5,789,815 A | 8/1998 | Tessier et al. |
| 5,801,439 A | 9/1998 | Fujisawa et al. |
| 5,804,874 A | 9/1998 | An et al. |
| 5,805,422 A * | 9/1998 | Otake et al. ............... 361/749 |
| 5,834,339 A | 11/1998 | DiStefano et al. |
| 5,835,988 A | 11/1998 | Ishii |
| 5,844,315 A | 12/1998 | Melton et al. |
| 5,861,666 A | 1/1999 | Bellaar |
| 5,883,426 A | 3/1999 | Tokuno et al. |
| 5,956,234 A | 9/1999 | Mueller |
| 6,030,856 A | 2/2000 | DiStefano et al. |
| 6,072,233 A | 6/2000 | Corisis et al. |
| 6,093,029 A | 7/2000 | Kwon et al. |
| 6,121,676 A | 9/2000 | Solberg |
| 6,180,881 B1 | 1/2001 | Isaak |
| 6,195,268 B1 | 2/2001 | Eide |
| 6,218,848 B1 | 4/2001 | Hembree et al. |
| 6,225,688 B1 | 5/2001 | Kim et al. |
| 6,232,152 B1 | 5/2001 | DiStefano et al. |
| 6,268,649 B1 | 7/2001 | Corisis et al. |
| 6,291,259 B1 | 9/2001 | Chun |
| 6,303,997 B1 | 10/2001 | Lee |
| 6,313,522 B1 | 11/2001 | Akram et al. |
| 6,335,565 B1 | 1/2002 | Miyamoto et al. |
| 6,342,728 B1 | 1/2002 | Miyazaki et al. |
| 6,369,445 B1 | 4/2002 | Khoury |
| 6,388,264 B1 | 5/2002 | Pace |
| 6,462,421 B1 | 10/2002 | Hsu et al. |
| 6,496,026 B1 | 12/2002 | Long et al. |
| 6,515,870 B1 | 2/2003 | Skinner et al. |
| 2001/0006252 A1 | 7/2001 | Kim et al. |

FOREIGN PATENT DOCUMENTS

| | | |
|---|---|---|
| JP | 56-61151 | 5/1981 |
| JP | 57-31166 A1 | 2/1982 |
| JP | 58-178529 | 10/1983 |
| JP | 60-194548 | 3/1984 |
| JP | 61-029140 | 2/1986 |
| JP | 61-101067 | 5/1986 |
| JP | 61-120454 | 6/1986 |
| JP | 61-137335 | 6/1986 |
| JP | 61-255046 | 11/1986 |
| JP | 63-18654 | 1/1988 |
| JP | 64-71162 | 3/1989 |
| WO | WO-03/019654 | 3/2003 |

OTHER PUBLICATIONS

"Megabyte Per Cubic Inch," Defense Science, May 1988, p. 56.

"Three-Dimensional Packaging," Defense Science, May 1988, p. 65.

Bang, U.S. Appl. No. 10/656,534, filed Sep. 5, 2003.

Fjelstad, U.S. Appl. No. 10/077,388, filed Feb. 15, 2002.

Forthun, U.S. Appl. No. 07/552,578, filed Jul. 13, 1990.

Mohammed, Serial No. PCT/US02/26805, filed Aug. 22, 2002.

Newsam, U.S. Appl. No. 60/314,042, filed Aug. 22, 2001.

* cited by examiner

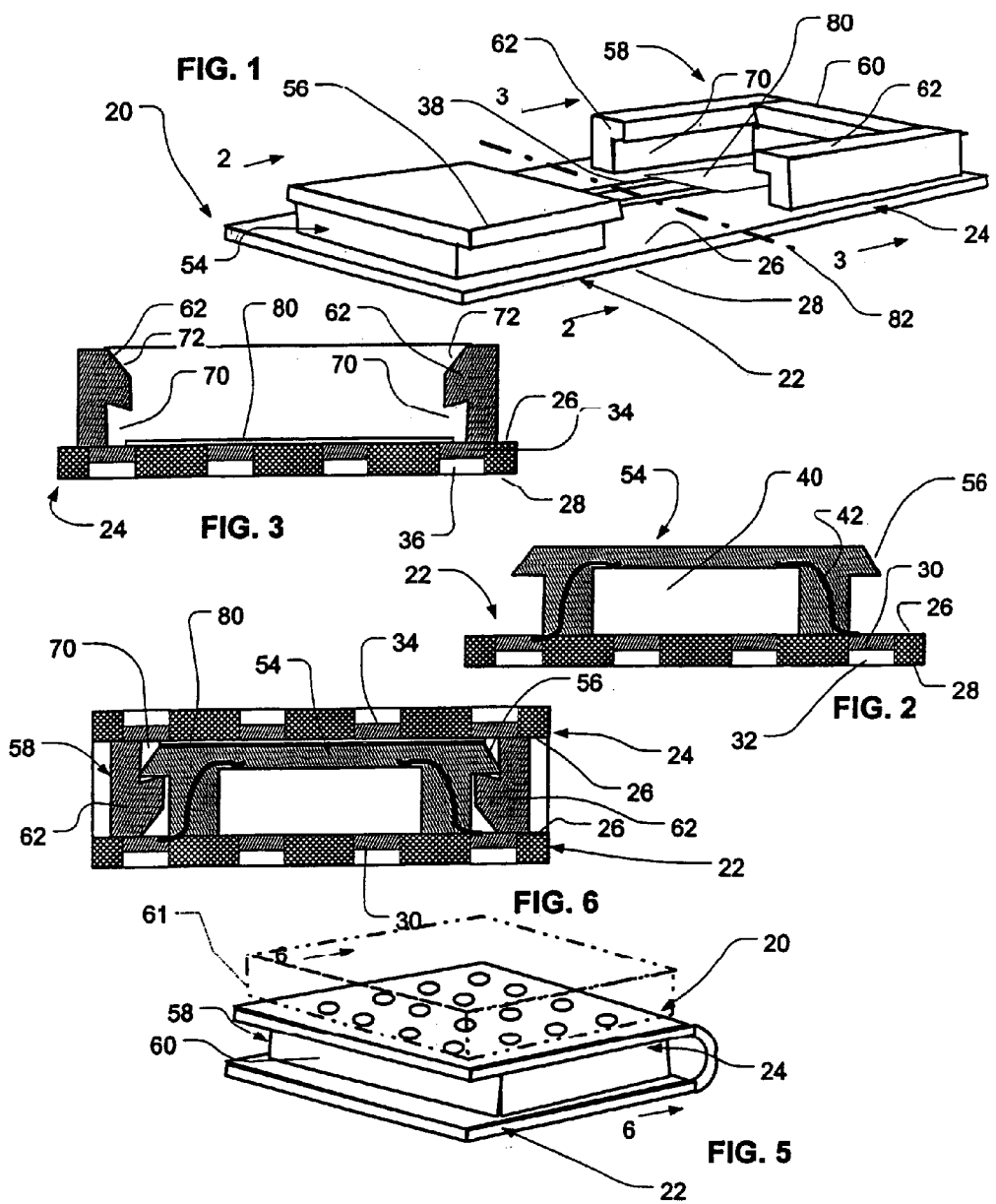

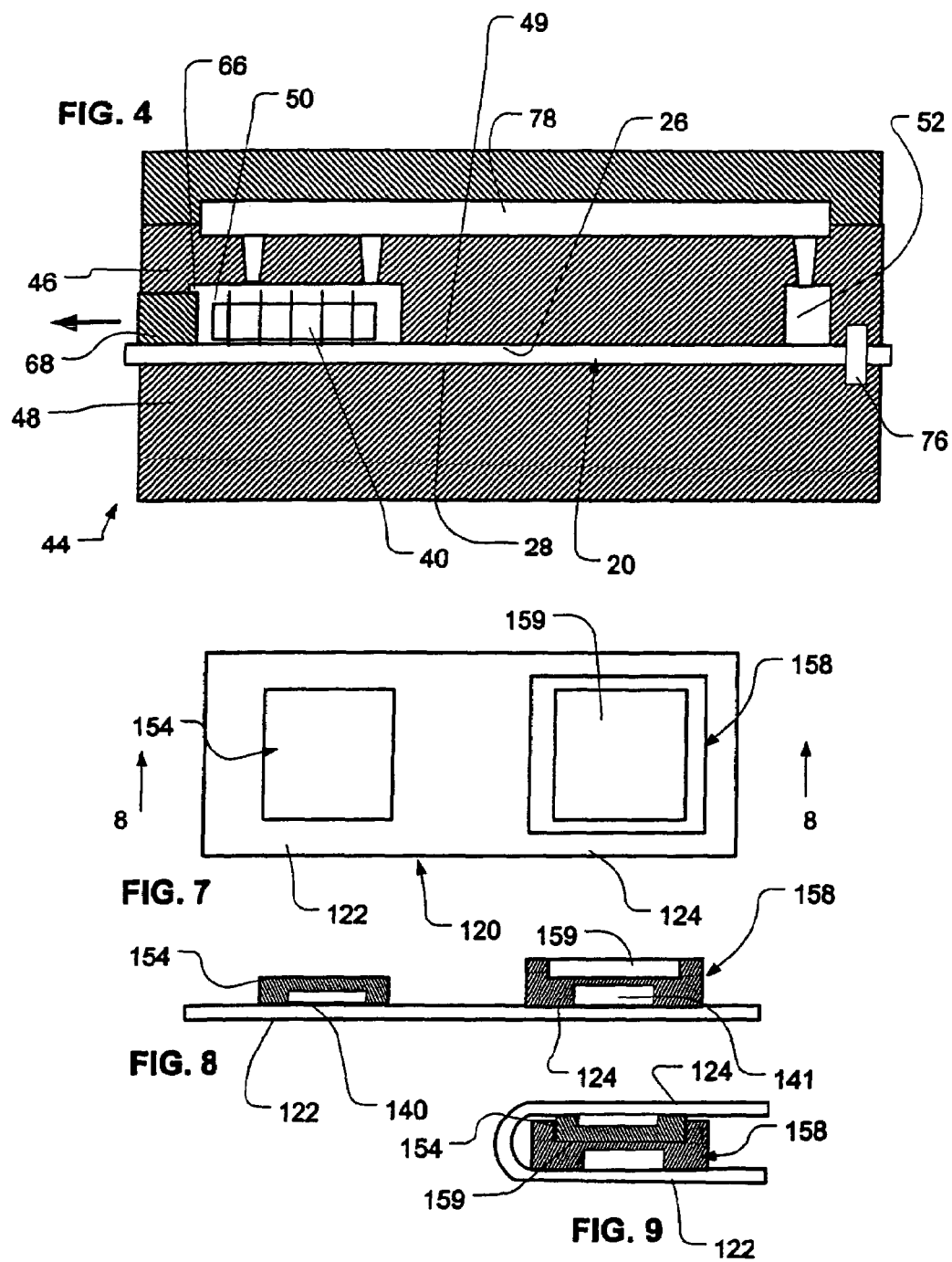

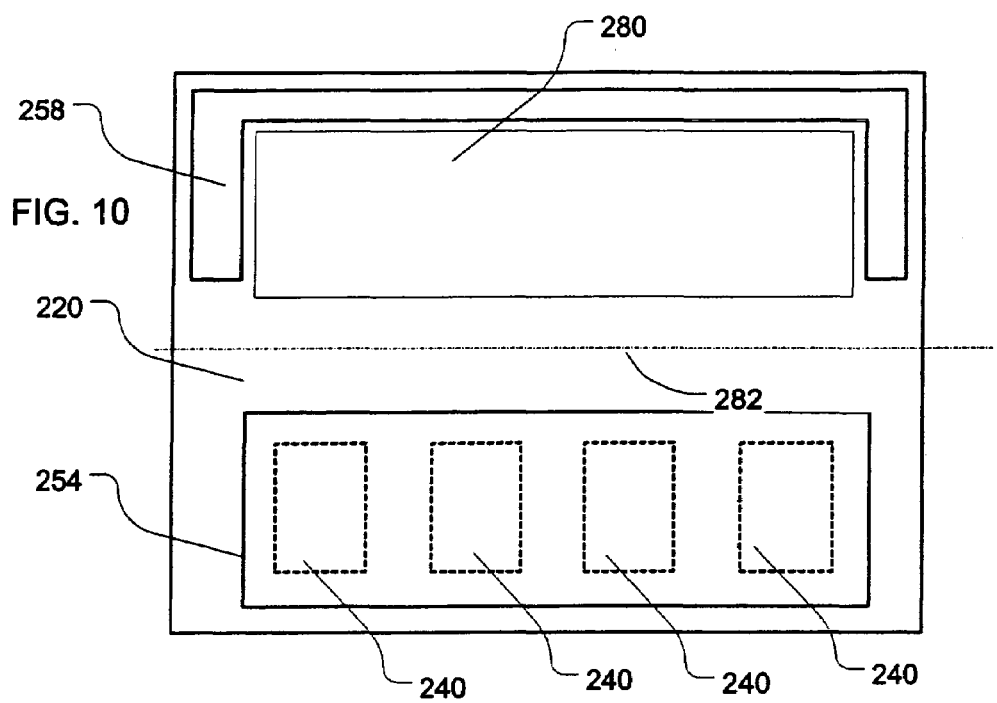
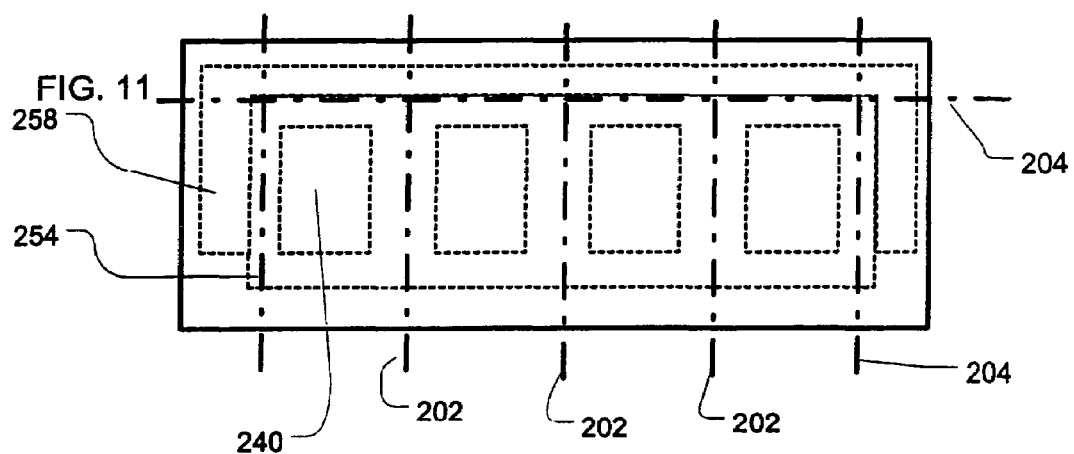

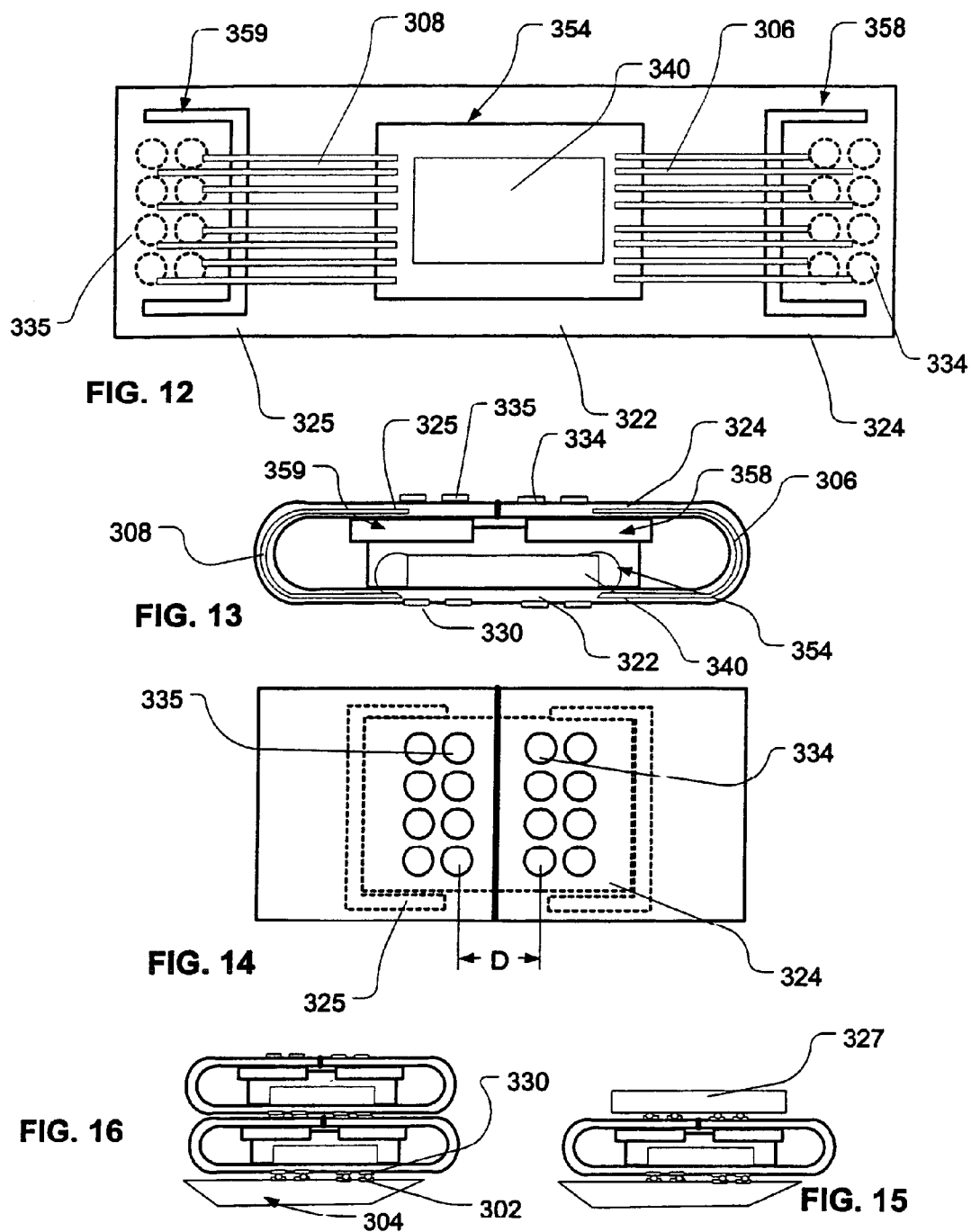

MICROELECTRONIC PACKAGES WITH SELF-ALIGNING FEATURES

CROSS-REFERENCE TO RELATED APPLICATIONS

The present application claims benefit of U.S. Provisional Patent Application Ser. No. 60/403,939, filed Aug. 16, 2002, the disclosure of which is hereby incorporated by reference herein.

FIELD OF THE INVENTION

The present invention relates to microelectronic assemblies and to components and methods for making the same.

BACKGROUND OF THE INVENTION

Certain microelectronic packages are made using a sheet like element incorporating a dielectric layer structure and mounting terminals disposed on this structure. Some or all of the terminals are connected to the microelectronic device to be packaged. In many cases, the active microelectronic device such as a semiconductor chip is covered by an encapsulant. The encapsulant commonly is molded in place on the dielectric layer so that the mass of encapsulant has a preselected shape, and so that the encapsulant covers the microelectronic device. The encapsulant may also cover features such as wire bonds which connect the actual chip to the terminals. Such a package may be mounted on a circuit panel such as a circuit board by bonding or otherwise connecting the mounting terminals to contact pads on the circuit board.

Various proposals have been advanced for stacking plural chips one above the other in a common package. One such arrangement includes a substrate having a dielectric structure substantially larger in area than the area of a single microelectronic device or chip. Several microelectronic devices are mounted to the substrate in different parts of the substrate and the substrate is folded so that the various microelectronic devices are stacked one above the other and so that the mounting terminals on the substrate are disposed at the bottom of the stack. Typically, the substrate has electrically conductive traces extending along the dielectric structure. These traces interconnect the microelectronic devices with one another, with the mounting materials or both in the completed structure. In one such structure, the substrate is in the form of an elongated strip and the various microelectronic devices are attached at spaced apart locations along the length of the strip. The strip is then folded into a serpentine configuration so that the microelectronic devices are stacked one above the other.

If the substrate is folded in precisely the right configuration, the various microelectronic devices will be disposed in the correct locations, one above the other. The entire package can be placed in an area of the circuit board only slightly larger than the area occupied by a single microelectronic device. However, inaccuracies in folding the substrate can cause parts of the package to lie in positions different from its nominal position relative to the mounting terminals. This effectively increases the overall size of the package. Neighboring components mounted to the circuit board must be located at a larger distance from the stack so as to provide clearance sufficient to accommodate this internal misalignment within the stack. Moreover, the piece-to-piece differences between nominally identical packages caused by folding inaccuracies can complicate the task of handling and feeding the stacked packages during automated assembly operations as, for example, during mounting to the circuit panel.

As disclosed in commonly assigned U.S. Pat. No. 6,225, 688, the disclosure of which is hereby incorporated by reference herein, a folding operation may be performed using a substrate having a plurality of microelectronic devices, or only a single microelectronic device, and also having additional terminals referred to herein as connection terminals. After folding, the mounting terminals of the substrate lie on the bottom of the folded structure, whereas the connection terminals lie on the top of the folded structure. Additional elements such as additional microelectronic packages can be mounted on top of the folded structure and connected to the folded structure through the connection terminals. Also, the connection terminals can be used as test terminals for testing the folded structure before or after mounting the same to a circuit panel. Inaccuracies in folding the substrate place the connection terminals at a position other than their nominal position. If an additional microelectronic element is mounted on top of the folded structure using the connection terminals, the additional microelectronic element will be displaced from its nominal position further, thus increasing the overall size of the package in the manner discussed above. Also, displacement of the connecting terminals from their nominal position can complicate the tasks of connection an additional element to the connection terminals and the task of engaging the connecting terminals with a test fixture during a testing operation.

It would be desirable to provide further improvement in substrate folding processes.

SUMMARY OF THE INVENTION

One aspect of the present invention provides a method of making a microelectronic package. A method according to this aspect of the present invention includes the step of providing first and second alignment elements on first and second parts of a substrate bearing a first microelectronic device and then folding the substrate so that the first and second alignment elements engage one another. Most preferably, the engaged first and second elements hold the second part of the substrate in a preselected disposition relative to the first part of the substrate. For example, the folding step may be performed so that the first and second parts of the substrate extend in planes substantially parallel to one another after the folding step and so that the engaged first and second elements limit the movement of the second part relative to the first part in at least some directions parallel to the planes of these parts. For example, the folding step may be performed so that the first and second parts of the substrate overlap one another and lie in substantially parallel planes, with the first microelectronic device disposed between the first and second parts of the substrate.

The first alignment element may be a mass of encapsulant at least partially covering the first microelectronic device. Where a second microelectronic device is provided on the substrate prior to folding, the second alignment element also may be a mass of encapsulant at least partially covering the second microelectronic device. Alternatively, one or both of the alignment elements may be a part separate from a microelectronic device. In one configuration, the first alignment element is a mass of encapsulant covering a first semiconductor chip, whereas the second alignment element generally in the form of a rectilinear ring or U-shaped element which engages the mass when the substrate is folded.

Most preferably, both of the alignment elements are formed using a common tool as, for example, by molding both alignment elements in place on the substrate using the same mold. This molding operation may be the same molding operation used to apply the encapsulant on the first microelectronic device. Thus, the alignment elements can be provided at essentially no additional cost. Alignment elements which are separate from the microelectronic device occupy only a minimal additional area on the substrate.

The method may include the additional step of forming an adhesive bond during or after the folding steps but the adhesive bond locks the second part of the substrate in position relative to the first part of the substrate set by the engagement between the alignment elements. For example, a part of the substrate may bear an adhesive layer and this layer may form a bond to the encapsulant mass covering the first microelectronic device. Where such an adhesive bond is formed, the alignment elements can be removed after the folding step as, for example, by cutting away that portion of the substrate bearing one of the alignment elements. The method may be applied to a substrate bearing a plurality of microelectronic devices as, for example, a plurality of microelectronic devices. After folding and, preferably, after formation of an adhesive bond, the substrate may be severed so as to form individual units each including a portion of the folded substrate and one or more of the microelectronic devices.

A further aspect of the present invention provides an intermediate structure for making a microelectronic package. The structure according to this aspect of the invention desirably includes a substrate having first and second parts and a first microelectronic device attached to the substrate in one of the parts. A first alignment element is attached to the first part of the substrate and the second alignment element is attached to the second part of the substrate. The substrate is adapted for folding so as to bring the first and second alignment elements into engagement with one another. The alignment elements are adapted to engage one another so as to retain the second part of the substrate in a preselected disposition relative to the first part of the substrate. Here again, one or both of the alignment elements may include a mass of encapsulant at least partially covering a microelectronic device. The substrate may be a partially or completely flexible sheet like element.

Yet another aspect of the invention provides a microelectronic package including a substrate having first and second parts. The package according to this aspect of the invention desirably also includes a first alignment element attached to the first part of the substrate and a second alignment element attached to the second part of the substrate. The substrate is folded so that the alignment elements are engaged with one another and retain the second part of the substrate in a preselected disposition relative to the first part of the substrate. As discussed above in connection with the method, the substrate desirably is folded so that the first and second parts of the substrate lie at least partially in planes parallel to one another and so that the engaged first and second elements limit movement of the second part of the substrate relative to the first part in at least some directions parallel to the planes.

A further aspect of the present invention provides a microelectronic package comprising an elongated substrate such as an elongated strip having a proximal part, a distal part and a central part disposed between the proximal and distal parts. The package includes a microelectronic device mounted to one of these parts. The substrate is folded so that the proximal and distal parts overlie the central part, and so that the microelectronic device disposed between the central part and at least one of the proximal and distal parts. For example, the microelectronic device may be mounted on the central part and both the proximal and distal parts may overlie the microelectronic device. The substrate has a proximal set of traces extending along the substrate from the central part to the proximal part and has a distal set of traces extending along the substrate from the central part to the distal part. Thus, in the folded condition, the traces extend across folds on opposite sides of the structure. The substrate desirably has a set of central terminals disposed on the central part, a set of proximal terminals disposed on the proximal part and a set of distal terminals disposed on the distal part. In the folded condition, the proximal and distal terminals desirably form an array of terminals on one side of the package. The proximal set of traces connects at least some of said proximal terminals with at least some of the central terminals, with the microelectronic device, or both, whereas the distal set of traces connects the distal terminals with at least some of said central terminals, with the microelectronic device, or both. The use of two sets of traces extending across two separate folds to connect the array of terminals with the remainder of the package greatly simplifies routing of the traces. This can reduce the number of metallic layers required in the substrate. Most preferably, the substrate includes only a single layer of traces.

BRIEF DESCRIPTION OF THE DRAWINGS

FIG. 1 is a diagrammatic perspective view of an in process article according to one embodiment of the invention.

FIG. 2 is a diagrammatic sectional view taken along the line 2—2 in FIG. 1.

FIG. 3 is a diagrammatic sectional view taken along line 3—3 in FIG. 1.

FIG. 4 is a diagrammatic sectional view of a mold used in forming the article of FIGS. 1–3 during one stage in production of the article.

FIG. 5 is a diagrammatic perspective view of a package formed from the article of FIGS. 1–3.

FIG. 6 is a diagrammatic sectional view taken along line 6—6 in FIG. 5.

FIG. 7 is a diagrammatic plan view of an in process article in accordance with a further embodiment of the invention.

FIG. 8 is a diagrammatic sectional view taken along line 8—8 in FIG. 7.

FIG. 9 is a sectional view similar to FIG. 8 but depicting the finished package formed from the components of FIGS. 7 and 8.

FIG. 10 is a diagrammatic plan view of an in process component according to a further embodiment of the invention.

FIG. 11 is a diagrammatic plan view of the component of FIG. 10 at a later stage of manufacture.

FIG. 12 is a top plan view of a component according to yet another embodiment of the invention.

FIG. 13 is an elevational view of the package made using the component of FIG. 12.

FIG. 14 is a plan view of the components depicted in FIG. 13.

FIGS. 15 and 16 are elevational views showing the package of FIGS. 13 and 14 in conjunction with other components.

DETAILED DESCRIPTION

Figure 17:
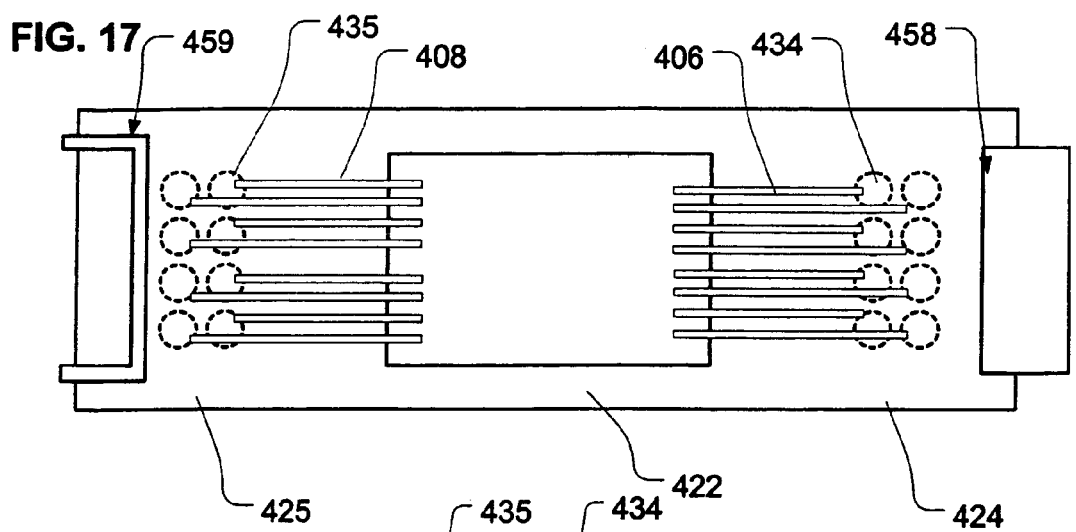
FIG. 17 is a plan view of a component according to yet another embodiment of the invention.

A component according to one embodiment of the invention includes a dielectric substrate 20 in the form of an elongated strip having a first part 22 adjacent one end and a second part 24 adjacent the opposite end. The substrate has an interior surface 26 (the surface facing upwardly in FIG. 1) and an exterior surface 28 (facing downwardly in FIG. 1). A set of electrically conductive mounting terminals 30 (FIG. 2) are provided on the first part 22 of the substrate. Terminals 30 are disposed at or near the interior surface 26 of the substrate and exposed to the exterior surface through holes or vias 32 extending through the substrate. Connecting terminals 34 (FIG. 3) are provided in the second part 24 of the substrate. The connecting terminals are exposed to the external surface 28 of the substrate through holes 36. The substrate also includes electrically conductive traces 38 extending between the first and second parts of the substrate and interconnecting at least some of the connecting terminals 34 with at least some of the mounting terminals 30. Only a few of the traces 38 are depicted in FIG. 1 for clarity of illustration. Substrate 20 may be formed from essentially any flexible dielectric material as, for example, one or more layers of a dielectric such as polyimide, BT or flexibilized epoxy. The conductive features such as terminals 32 and 34 and traces 38 may be formed from a conventional metallic elements of the type commonly used in flexible circuitry as, for example, copper or gold formed by selective deposition such as plating or by selective removal from a layer, as by etching. The techniques commonly employed to make flexible circuitry can be employed in fabrication of substrate 20 and the metallic features thereon. The substrate may include additional features as, for example, one or more additional layers of traces and electrically conductive planes such as metallic layers which can serve as a ground or power planes and which cooperate with the traces to form controlled impedance striplines.

A first microelectronic device 40 such as a semiconductor chip (FIG. 2) is mounted on the interior surface 26 of the substrate in the first area 22. Device 40 is electrically connected to at least some of the conductive features on the substrate in a conventional manner as, for example, by wire bonding using fine wires 42 to connect contacts on the chip to metallic elements of the substrate such as terminals 30 or traces 38.

In a manufacturing process used to form the component of FIGS. 1–3, the substrate 20, with first microelectronic device or chip 40 thereon, is engaged in a mold 44 (FIG. 4). The mold may be a conventional transfer, injection, compression mold having a first part 46 and a second part 48. The first mold part 46 has a parting surface 49, which engages the interior surface 26 of the substrate. The second mold part 48 engages the exterior surface. A first element cavity 50 and a second element cavity 52 are provided in the first mold part 46. These cavities are open to the parting surface 49 of the first mold part. Cavity 50 is in the form of a generally rectangular block or mass 54 (FIG. 1) having a projecting ridge 56 at the top of the mass, remote from substrate 20. As best seen in FIG. 4, the chip or first microelectronic device 40 is disposed within the first element cavity 50 when the substrate is engaged with the mold. The portion 66 of cavity 50 (FIG. 4) which forms ridge 56 (FIG. 1) extends outwardly from the remainder of cavity 50 in a direction perpendicular to the direction of motion of the molded part during ejection from the mold and forms a "undercut" in the mold. To permit extraction of the molded article from the mold, mold part 46 may be provided with one or more elements 68 arranged to move in the directions parallel to the parting plane 49 of the mold (to the left or right in FIG. 4) when the mold opens. Such elements are commonly referred to in the mold making art as "side draws." Numerous techniques for moving side draws in conjunction with the opening and closing motion of the mold are well known to those skilled in the mold making art.

Cavity 52 is in the form of a generally rectilinear U or three-sided box having a base wall 60 and a pair of side walls 62 projecting from the base wall. Only that part of cavity 52 which forms the base wall 60 (FIG. 1) is visible in the sectional view of FIG. 4. Also, as best seen in FIGS. 1 and 3, the interior surfaces of side walls 62 of the element 58 formed in the second element cavity 50 (FIG. 4) are provided with undercuts 70 and with lead-in chamfers 72 adjacent the top edges of these walls, remote from substrate 20. Mold element 46 may include a core or internal element (not shown) arranged to form these features. The core may be collapsible or otherwise moveable so as to allow extraction of the molded part from this region of the mold. Here again, the mold making techniques used to permit molding of the desired shape are well-known to those skilled in the mold making art.

Because cavities 50 and 52 are parts of a common mold 44, these cavities may be formed in extremely precise spatial relationship to one another. Substrate 20 is engaged in mold 44 in registration with cavities 50 and 52, so that features of the substrate such as the edges of the dielectric layer and the terminals 34 and 30 (FIGS. 2 and 3) lie in pre-determined spatial relationships to the cavities. Merely by way of example, substrate 20 may be provided with holes in pre-determined spatial relationship to other features of the substrate. Pins 76, which only one is visible in FIG. 4, may extend from one or both of the mold parts 46 and 48 through the substrate.

With substrate 20 disposed in the mold, a moldable encapsulant such as a thermosetting or thermoplastic polymer composition is introduced into cavities 50 and 52 through channels 78 in the mold, until the encapsulant fills the cavities. The encapsulant is then brought to a solid condition by chemical reaction or by cooling. Preferably, the material in its solid condition is relatively rigid. Essentially any material commonly usable as a protective overmolding material in electronic packaging can be employed. Merely by way of example, thermal setting resins such as epoxies and phenolics may be employed. Some suitable resins include those sold under the designations EME-7730 and EME-7730L by the Sumitomo Bakelite Company Limited of Tokyo, Japan. These resins have a flexural modulus of about 2400 kg/mm$^2$ at 25° C. and about 150–155 kg/mm$^2$ at 240° C. Resins of this type adhere well to electronic components and to dielectric polymers such as polyimide. After the encapsulating material has been introduced into cavities 50 and 52 and brought to a solid condition, the part is ejected from the mold using conventional techniques. At this stage, the component has a first alignment element in the form of mass 54 (FIGS. 1 and 2) covering the first microelectronic device or chip 40, the first element 54 being disposed on the first part 22 of substrate 20. The component also has a U-shaped second alignment element 58 on the second part 24 of the substrate. Both of these alignment elements overlie the interior surface 26 of the substrate. A thin layer of an adhesive 80 is applied on the interior surface 26 of the second part 24 of the substrate, within the region encompassed by the U-shaped second alignment element 58. This layer of adhesive may be provided as a pre-formed film of the type commonly referred to as a "dry pad" adhesive.

Although the processing steps used to form the component of FIGS. 1–3 have been described with reference to a single component, it should be appreciated that these processing steps can be performed while substrate 20 is a part of a larger sheet or tape. For example, substrate 20 can be formed as part of a continuous or semi-continuous tape which is advanced through the mold in a step-wise fashion, so as to form one or more sets of alignment elements on individual portions of the tape, so as to produce a large number of components in sequence.

In the next stage of the process, substrate 20 is folded over upon itself by bending generally around an axis 82 (FIG. 1) between the first and second parts 22 and 24 of the substrate, so as to bring the substrate to the folded condition depicted in FIGS. 5 and 6. In this condition, the second part 24 of the substrate overlies the first part, with the interior surface 26 in the second part confronting the interior surface in the first part. The first alignment element or mass 54 enters into the opening defined by the second alignment element 58, so that mass 54 is disposed between the side walls 62 of the second element. The dimensions of the mass 54 and the dimensions of the second element 58 are arranged to provide a close fit between the first element or mass 54 and the second or U-shaped element 58. The first alignment element or mass 54 desirably also abuts the back wall 60 (FIGS. 1 and 5) of the second alignment element 58. The engaged first element 54 and second element 58 hold the second part of substrate 20 in precise position relative to the first part 22. Stated another way, the engaged elements limit relative movement of the two parts 22 and 24 in at least some directions parallel to the planes of these parts. These directions, to the left and right in FIG. 6 and into and out of the plane of the drawing in FIG. 6, are referred to herein as "horizontal directions." As the parts are engaged with one another during the folding operation, the engagement of the first and second alignment elements 54 and 58 brings the two parts 22 and 24 of the substrate to the desired relative positions in the horizontal directions. This positioning action of the alignment elements assures that the connection terminals 34 on the second part 24, at the top of the assembly, will lie in the desired positions in the horizontal directions relative to the mounting terminals 30 on the first part 22 of the substrate. Consequently, if a further element is mounted on connecting terminals 34, that further element also can be precisely registered with the mounting terminals 30 in the horizontal directions.

As first element 54 moves into engagement with second element 58, the lead-in chamfers 72 on the walls of the second element and corresponding chamfers on the top of the first element aid in bringing the parts to the proper alignment. The ledge 56 on the mass or first element enters into the undercuts 70 on the inside of the walls of the second element and, thus, locks the two elements together. This holds substrate 20 in the folded condition. Additionally, the adhesive layer 80 on the substrate interior surface bonds to the top of mass 54, thereby further securing the elements in position. Although both of the alignment elements are formed from a relatively rigid encapsulating material, the second element 58 desirably has at least enough flexibility to permit ledge 56 to pass by the projecting portions of the walls and enter into undercut 70. Walls 62 and 60 are relatively thin and reside on the flexible substrate 20. Thus, these elements are free to flex to the required degree to allow the wall 62 to splay outwardly slightly as the protruding ledge 56 of the first element enters between them and passes inwardly to the undercut.

Because the first and second alignment elements 54 and 58 are formed in a common mold, they can be in precise registration with one another and can be precisely registered with the features of the substrate. Moreover, because these elements are formed from the same material at the same time and under the same molding conditions, factors such as dimensional changes in the molding material upon curing and dimensional changes in substrate 20 tend to affect both of these elements to substantially the same degree. All of these features help to contribute to the precise registration achievable in the folded article. The alignment elements are provided at essentially zero additional cost. The first element 54 is a mass of encapsulation material which would be required in any event to cover the first microelectronic device 40. The incremental cost of forming the second element 58 is infinitesimal; it consists principally of the cost of the molding material in this element. No additional molding time is required. Also, no additional operations are required to engage the alignment elements 54 and 58 with one another; they automatically engage one another when the substrate is folded.

The package of FIGS. 5 and 6 may be mounted to a circuit panel by attaching mounting terminals 30 (FIG. 6) to contact pads of a circuit panel (not shown). Before or after the package is mounted to the circuit panel, one or more additional devices 61 such as additional packaged or unpackaged microelectronic devices can be mounted to the top or second part 24 of the substrate, as by connecting such additional devices to the connection terminals 34. The additional package may be a package identical to the package of FIGS. 5 and 6, two or more such packages can be connected in a stack.

A component according to a further embodiment of the invention (FIGS. 7 and 8) is similar to the component discussed above, in that it incorporates a substrate 120 having a first part 122 and a second part 124. Here again, a first microelectronic device or semiconductor element 140 (FIG. 8) is mounted to the first part 122 of the substrate and a first alignment element 154 is formed as a mass of an encapsulant covering the first microelectronic device. The component of FIGS. 7 and 8 also has a second microelectronic device 141 such as a second semiconductor chip (FIG. 8) mounted to the second part 124 of the substrate. The second alignment element 158 is in the form of a second mass of encapsulant covering the second microelectronic device 141. This second element or mass has an opening or recess 159 in its top surface sized to receive mass 154. In the folded condition (FIG. 9), the first element 154 is engaged in recess 159 of the second element 158. Here again, the engaged alignment elements constrain the first and second parts 120 and 124 of the substrate and guide these parts into the proper alignment during the folding operation. A component according to this embodiment of the invention may be formed by a process similar to that discussed above. A first chip or microelectronic device 140 is received in one cavity of the mold; whereas the second chip or microelectronic device 141 is received in another cavity in the same mold, so that once again the two alignment elements are formed in the same molding operation. The component and folded package of FIG. 9 may have the other features discussed above with reference to FIGS. 1–6, such as mounting terminals on one part of the substrate for mounting the folded package to a circuit panel and connecting terminals on the opposite part of the substrate for connecting additional elements or for testing the finished product. Here again, these two sets of terminals will be held in precise registration with one another. The mating alignment elements of FIGS. 7–9 do not include undercuts to hold the assembly in the folded condition. An adhesive (not shown) may be provided on one or both of the alignment elements for this purpose.

The component of FIG. 10 includes several microelectronic devices 240, all enclosed in a common mass or overmolding 254, which serves as a first alignment element during the folding operation discussed below. The component also has a large second alignment element 258 on the same large, unitary substrate 220. Elements 254 and 258 can be formed by a molding process similar to that discussed above. In the molding process, all of the microelectronic devices 240 are encapsulated simultaneously. After the alignment elements 254 and 258 have been formed, the substrate is folded generally about axis 282 so as to bring the component to the folded condition depicted in FIG. 11, with alignment elements 254 and 258 inter-engaged with one another. Here again, the engaged alignment elements assure that the overlapping portions of the substrate are in precise registration with one another. Here again, an adhesive such as an adhesive layer 280 carried by the substrate is used to form a bond which secures the substrate in its folded condition. Thus, the alignment elements need not have locking features such as the ridge and undercuts discussed above. Other types of adhesive may be employed as, for example, an adhesive carried on the top surface of element 254 or a flowable adhesive applied to the assembly during or after folding.

After the adhesive has set and formed a bond, the component may be severed, as by cutting along lines 202 so as to separate portions of the folded component from one another and form individual units, each including one or more of the microelectronic devices 240 and the associated portions of the folded substrate. At the same time, the substrate can be severed along further lines 204 so as to trim off portions of the substrate occupied by the second alignment element 258, which is no longer needed after the adhesive bond has been formed. Assemblies such as that discussed above with reference to FIGS. 7–9, where microelectronic devices are present on both parts of the substrate, may also include multiple devices. In such an arrangement, each of the masses or alignment elements 154 and 158 may be a relatively large mass including numerous microelectronic devices. These masses are severed along with the substrate when the individual units are separated from one another.

The component depicted in FIG. 12 has a first alignment element 354 formed from an encapsulation material covering a first semiconductor device or chip 340 disposed in a first or central part 322 of the substrate. The component also has a second alignment element 358 disposed in a second or proximal end part 324 of the substrate extending outwardly from the first part 322 in a first or proximal direction. The component in accordance with this embodiment additionally has a third alignment element 359 disposed in a third or distal end part 325 of the substrate extending away from the first pr central part in the opposite, distal direction (to the left as seen in the unfolded plan view of FIG. 12). In the folded condition (FIG. 13), the proximal and distal end parts 324 and 325 both overlap the central part 322 and the first alignment element or device encapsulation 354. Both the second alignment element 358 and the third alignment element 359 are engaged with the first alignment element 354 during the folding operation. The alignment elements thus guide both of the proximal and distal end parts 324 and 325 into a precise, pre-determined registration with the first part 322 and also into a precise, pre-determined positional relationship with one another. This assures that connection terminals 334 on the second or proximal end part 324 and connection terminals 335 on the third or distal end part 325 will lie in pre-determined positions relative to one another. For example, the distance D (FIG. 14) between a row of terminals 334 on second or proximal end part 324 and the neighboring row of terminals 335 on third or distal end part 325 is precisely determined by the alignment elements so that this distance can be maintained within a reasonable tolerance during mass production of the packages. Thus, the terminals 334 and 335 on the proximal and distal end parts of the substrate form a unified array which can be used, for example, to make connections with an additional device such as a further semiconductor chip 327 (FIG. 15). As also seen in FIG. 15, the mounting terminals 330 can be bonded to corresponding circuit pads 302 on a circuit board 304 or other circuit panel.

In this embodiment as well, the terminals 330 on the first part 322 of the substrate (FIG. 13) are exposed at the bottom of the folded structure. If the array formed by connection terminals 334 and 335 matches the array of mounting terminals 330, the package in the folded condition can be stacked with other identical packages as seen in FIG. 16. In this embodiment as well, the mounting terminals 330 on the bottom of the lower-most unit in the stack can be bonded to pads 302 of a circuit panel.

The component discussed above with reference to FIG. 12 has a proximal set of traces 306 extending along the substrate from the first or central part 322 of the substrate to the second or proximal part 324 and has another set of traces 308 extending from the first or central part 322 to the third or distal part 325. At least some of the connection terminals 334 in the second or proximal part 324 of the substrate are connected to at least some of the mounting terminals 330 in the first or central part 322 of the substrate or to the microelectronic device or chip 340 on the first part of the substrate by the traces of the first set, whereas at least some of the connection terminals 335 on the third or distal part of the substrate are connected to the mounting terminals or first microelectronic device in the first or central part 322 by the distal set of traces 308. Thus, in the folded package, the combined array of terminals 334 and 335 at the top of the package is connected to terminals 330 and device 340 at the bottom of the package in part by the proximal set of traces 306 extending across one fold on one side of the folded structure and in part by the distal set of traces 308 extending across another fold on the other side of the structure. This arrangement significantly simplifies routing of the traces within the substrate. The number of traces in each set can be one-half the number which would be required to connect all of the terminals 334 and 335 using a single set of traces extending across a single fold. This simplified routing can reduce the number of metallic layers required in the substrate. In many cases, all of the traces can be formed in a single layer.

Figure 18:
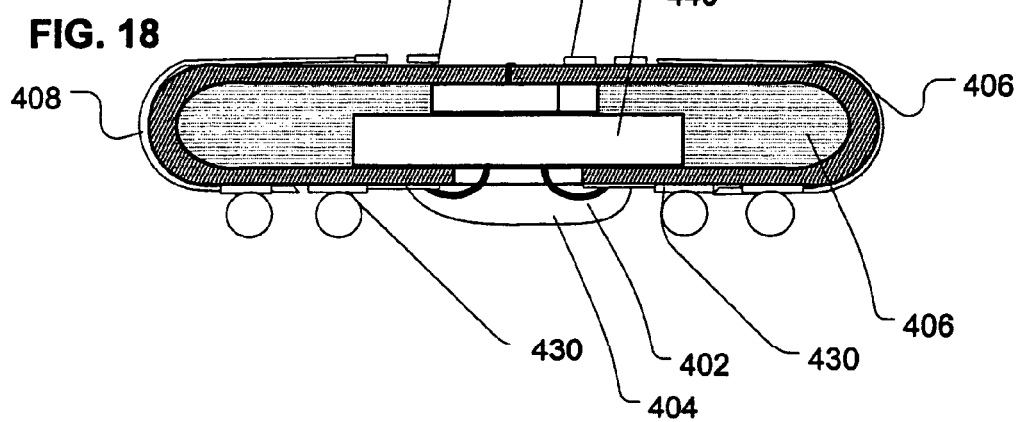
FIG. 18 is an elevational view of the component of FIG. 15 at a later stage of manufacture.

The component of FIG. 17 also includes a substrate in the form of an elongated strip having a first or central part 422, a second or proximal end part 424 extending on one side of first or central part and a third or distal end part 425 extending on the opposite side of the central part 422. Here again, terminals 434 and 435 are connected to the device, to terminals 430 in the first or central part 422 of the substrate, or both, by separate sets of traces 406 and 408 extending in opposite directions from the first or central part of the substrate to the proximal and distal parts of the substrate and, hence, extending around opposite folds in the folded configuration (FIG. 18). However, the component of FIG. 17 has a first alignment element 458 at one end, on second or proximal part 424 of the substrate, and has a second alignment element 459 at the opposite end, in the third or distal part 425 of the substrate. These alignment elements are arranged to engage one another in the folded condition of the substrate so as to maintain the second or proximal part 424 of the substrate in a pre-determined positional relationship to the third or distal part 425, and thereby maintain terminals 434 in a pre-determined positional relationship to terminals 435. In the embodiment illustrated, the chip or first microelectronic device 440 is not covered by an encapsulant at the time of folding and does not serve as an alignment element. Also, as best seen in FIG. 18, the traces 406 and 408 are disposed on the exterior surface of the substrate and the chip 440 is connected to these terminals by conductive elements such as wire bonds 402 extending through a hole in the substrate. Other forms of conductors may be used as, for example, leads formed integrally with the traces or with the terminals 430 on the first part of the substrate. An encapsulant 404 may be provided to cover these leads. A further encapsulant 406 may be provided within the folded substrate so that the further encapsulant provides an additional adhesive bond between the overlapping portions of the substrate. This additional adhesive bond secures the various parts of the substrate in position relative to one another.

Numerous variations and combinations of the features discussed above can be utilized without departing from the present invention. In one such variant, the roles of the mounting terminals and connection terminals discussed above are reversed. For example, the package of FIGS. 5 and 6 can be mounted to the circuit board by connection terminals 34 and additional microelectronic devices or packages can be connected to mounting terminals 30. Similarly, the combined array of connection terminals 334 and 335 in the embodiment of FIGS. 13–16 can be used to mount the package to the circuit panel, so that the mounting terminals 330 face upwardly, away from the circuit panel. The mounting terminals can be used to connect an additional package or other device. Also, terminals other than the solder-bondable pads shown in the drawings, such as pins projecting from the substrate and adapted to be received in a socket, can be employed.

The inter-engagement of alignment elements can be used in more complex folded structures. For example, as disclosed in commonly-assigned, co-pending U.S. patent application Ser. No. 10/077,388, filed Feb. 15, 2002, a substrate in a generally cruciform shape having multiple arms extending from a central region can be folded so that the various arms all overlie the central region, and so that microelectronic devices positioned on all of the arms are stacked one above the other. Such a structure can be provided with alignment elements on two or more parts of the substrate as, for example, on one or more of the various arms, on the central portion, or both, so as to hold the parts of the substrate in a desired positional relationship when the substrate is in a folded condition. Also, the particular shapes of the alignment elements discussed above are illustrative only. Alignment elements having other shapes can be employed. For example, an alignment element on one part of a substrate may define a circular or cylindrical recess, or a plurality of such recesses, whereas an alignment element on the mating part of the substrate may define one or more pins adapted to fit within such recess or recesses. In a further variant, the alignment elements can be features of the substrate itself.

Features of the substrate itself which constitute alignment elements should be considered as "attached" or "mounted" to the substrate. Also, the alignment elements can be formed from essentially any material. Merely by way of example, a pin-shaped metallic alignment element can be formed by processes similar to those used to form terminals and via liners, whereas a recess can be formed by processes used to form vias in the substrate. Here again, the alignment elements can be formed at essentially no additional cost. In yet another arrangement, the substrate may be formed with holes used for aligning and registering the substrate during processing operation, such as the sprocket holes commonly provided on tape-like substrates. An alignment element projecting from a part of the substrate remote from one set of socket holes may engage that set of socket holes when the substrate is folded.

As these and other variations and combinations of the features discussed above can be utilized without departing from the present invention, the foregoing description of the preferred embodiment should be taken by way of illustration rather than by way of limitation of the invention as defined by the claims.

The invention claimed is:

1. An intermediate structure for making a microelectronic package comprising:
   (a) a substrate having first and second parts;
   (b) a first microelectronic device attached to said substrate;
   (c) a first alignment element attached to said first part of said substrate; and
   (d) a second alignment element attached to said second part of said substrate,
   said substrate being adapted for folding so as to bring said first and second alignment elements into engagement with one anther, said alignment elements being adapted to engage one another so as to retain said second part of said substrate in a pre-selected disposition relative to said first part of said substrate.

2. A structure as claimed in claim 1 wherein said substrate is a sheet-like element having an interior side and an exterior side, said alignment elements being disposed at least partially on said interior side of said substrate.

3. A structure as claimed in claim 1 wherein said first alignment element includes a mass of encapsulant at least partially covering said first microelectronic device.

4. A structure as claimed in claim 1 wherein said substrate has terminals exposed at said exterior surface in said first and second parts, at least some of said terminals being connected to said first microelectronic device.

5. A microelectronic package comprising:
   (a) a substrate having first and second parts;
   (b) a first microelectronic device attached to said substrate;
   (c) a first alignment element attached to said first part of said substrate; and
   (d) a second alignment element attached to said second part of said substrate, said substrate being folded so that said alignment elements are engaged with one another and retain said second part of said substrate in a pre-selected disposition relative to said first part of said substrate.

6. A package as claimed in claim 5 wherein said substrate is a sheet-like element having an interior side and an exterior side, said substrate being folded so that the interior side of said first part faces the interior side of said second part.

7. A package as claimed in claim 6 wherein, said first microelectronic device is disposed between said first and second parts of said substrate.

8. A package as claimed in claim 6 wherein said substrate has connecting terminals exposed at the exterior side of said second part.

9. A package as claimed in claim 6 or claim 7 wherein said substrate has bonding terminals exposed at the exterior side of said first part.

10. A package as claimed in claim 5 wherein said first and second parts of the substrate extend in planes substantially parallel to one another, and wherein the engaged first and second elements limit movement of said second part relative to said first part in at least some directions parallel to said planes.

* * * * *